(12) United States Patent
Basol

(10) Patent No.: US 8,916,412 B2
(45) Date of Patent: Dec. 23, 2014

(54) HIGH EFFICIENCY CADMIUM TELLURIDE SOLAR CELL AND METHOD OF FABRICATION

(75) Inventor: Bulent M. Basol, Manhattan Beach, CA (US)

(73) Assignee: Encoresolar, Inc., Manhattan Beach, CA (US)

(*) Notice: Subject to any disclaimer, the term of this patent is extended or adjusted under 35 U.S.C. 154(b) by 381 days.

(21) Appl. No.: 13/425,184

(22) Filed: Mar. 20, 2012

(65) Prior Publication Data

US 2012/0192948 A1 Aug. 2, 2012

Related U.S. Application Data

(63) Continuation-in-part of application No. 12/880,671, filed on Sep. 13, 2010, now Pat. No. 8,187,963.

(60) Provisional application No. 61/465,486, filed on Mar. 21, 2011, provisional application No. 61/396,227, filed on May 24, 2010.

(51) Int. Cl.
*H01L 31/18* (2006.01)
*H01L 29/45* (2006.01)
*H01L 31/0224* (2006.01)
*H01L 31/052* (2014.01)
*H01L 31/073* (2012.01)
*H01L 29/22* (2006.01)

(52) U.S. Cl.
CPC ........ *H01L 29/45* (2013.01); *H01L 31/022425* (2013.01); *H01L 31/0527* (2013.01); *H01L 31/073* (2013.01); *H01L 31/1828* (2013.01); *H01L 29/22* (2013.01); *Y02E 10/52* (2013.01); *Y02E 10/543* (2013.01)
USPC .................. 438/95; 438/48; 438/73; 136/260

(58) Field of Classification Search
CPC .................. H01L 27/1423; H01L 27/14696; H01L 31/02966; H01L 31/073
USPC .................................................. 438/48, 73, 95
See application file for complete search history.

(56) References Cited

U.S. PATENT DOCUMENTS

| 5,909,632 A | 6/1999 | Gessert |
| 2010/0015753 A1* | 1/2010 | Garnett ........................ 438/84 |
| 2010/0282320 A1 | 11/2010 | Meyers et al. |
| 2011/0240123 A1* | 10/2011 | Lin et al. ..................... 136/260 |

FOREIGN PATENT DOCUMENTS

WO WO-2012/129235 A1 9/2012

OTHER PUBLICATIONS

International Search Report mailed Jun. 25, 2012, for PCT Application No. PCT/US12/29815, filed Mar. 20, 2012, three pages.
Hsiao, K-J. et al. (2009). Electron Reflector Strategy for CdTe Solar Cells, IEEE pp. 001846-001850.

* cited by examiner

*Primary Examiner* — Ha Tran T Nguyen
*Assistant Examiner* — Suberr Chi
(74) *Attorney, Agent, or Firm* — Morrison & Foerster LLP

(57) ABSTRACT

A method of forming an ohmic contact and electron reflector on a surface of a CdTe containing compound film as may be found, for example in a photovoltaic cell. The method comprises forming a Cd-deficient, Te-rich surface region at a surface of the CdTe containing compound film; exposing the Cd-deficient surface region to an electron reflector forming material; forming the electron reflector; and laying down a contact layer over the electron reflector layer. The solar cell so produced has a Cd-deficient region which is converted to an electron reflector layer on the surface of a CdTe absorber layer, and an ohmic contact. A Cd/Te molar ratio within the Cd-deficient region decreases from 1 at an interface with the CdTe absorber layer to a value less than 1 towards the ohmic contact.

6 Claims, 5 Drawing Sheets

US 8,916,412 B2

HIGH EFFICIENCY CADMIUM TELLURIDE SOLAR CELL AND METHOD OF FABRICATION

CROSS-REFERENCE TO RELATED APPLICATIONS

This application claims priority benefit of U.S. provisional application No. 61/465,486, filed Mar. 21, 2011, and is a continuation-in-part of U.S. patent application Ser. No. 12/880,671, filed Sep. 13, 2010, which in turn claims priority benefit of U.S. provisional application No. 61/396,227, filed May 24, 2010, the contents of which are incorporated by reference herein in their entirety for all purposes.

FIELD OF THE INVENTION

The present invention relates to methods for fabricating thin film IIB-VIA compound solar cells, more specifically CdTe solar cells.

BACKGROUND OF THE INVENTION

Solar cells and modules are photovoltaic (PV) devices that convert sunlight energy into electrical energy. The most common solar cell material is silicon (Si). However, lower cost PV cells may be fabricated using thin film growth techniques that can deposit solar-cell-quality polycrystalline compound absorber materials on large area substrates using low-cost methods.

Group IIB-VIA compound semiconductors comprising some of the Group IIB (Zn, Cd, Hg) and Group VIA (O, S, Se, Te, Po) materials of the periodic table are excellent absorber materials for thin film solar cell structures. Especially CdTe has proved to be a material that can be used in manufacturing high efficiency solar panels at a manufacturing cost of below \$1/W.

FIG. 1 shows a commonly used structure of a CdTe based thin film solar cell. FIG. 1 shows a "super-strate" structure 10, wherein light enters the active layers of the device through a transparent sheet 11. The transparent sheet 11 serves as the support on which the active layers are deposited. In fabricating the "super-strate" structure 10, a transparent conductive layer (TCL) 12 is first deposited on the transparent sheet 11. Then a junction partner layer 13 is deposited over the TCL 12. A CdTe absorber film 14, which is a p-type semiconductor film, is next formed on the junction partner layer 13. Then an ohmic contact layer 15 is deposited on the CdTe absorber film 14, completing the solar cell. As shown by arrows 18 in FIG. 1, light enters this device through the transparent sheet 11. In the "super-strate" structure 10 of FIG. 1, the transparent sheet 11 may be glass or a material (e.g., a high temperature polymer such as polyimide) that has high optical transmission (such as higher than 80%) in the visible spectra of the sun light. The TCL 12 is usually a transparent conductive oxide (TCO) layer comprising any one of; tin-oxide, cadmium-tin-oxide, indium-tin-oxide, and zinc-oxide which are doped to increase their conductivity. Multi layers of these TCO materials as well as their alloys or mixtures may also be utilized in the TCL 12. The junction partner layer 13 is typically a CdS layer, but may alternately be compound layer such as a layer of CdZnS, ZnS, ZnSe, ZnSSe, CdZnSe, etc. The ohmic contact 15 is made of a highly conductive metal such as Mo, Ni, Cr, Ti, Al or a doped transparent conductive oxide such as the TCOs mentioned above. The rectifying junction, which is the heart of this device, is located near an interface 19 between the CdTe absorber film 14 and the junction partner layer 13.

Ohmic contacts to p-type CdTe are difficult to make because of the high electron affinity of the material. Various different approaches have been reported on the topic of making ohmic contacts to CdTe films. For example, U.S. Pat. No. 4,456,630 by B. Basol describes a method of forming ohmic contacts on a CdTe film comprising etching the film surface with an acidic solution, then etching with a strong basic solution and finally depositing a conductive metal. In U.S. Pat. No. 4,666,569 granted to B. Basol a multi layer ohmic contact is described where a 0.5-5 nm thick interlayer of copper is formed on the etched CdTe surface before a metallic contact is deposited. U.S. Pat. No. 4,735,662 also describes a contact using 1-5 nm thick copper, an isolation layer such as carbon, and an electrically conducting layer such as aluminum. U.S. Pat. No. 5,909,632 describes a method of improving contact to CdTe by depositing a first undoped layer of ZnTe, then depositing a doped ZnTe layer, such as metallic Cu as the dopant at concentrations of about 6 atomic percent, and finally depositing a metal layer. U.S. Pat. No. 5,472,910 forms an ohmic contact by depositing a viscous liquid layer containing a Group IB metal salt on the CdTe surface, heating the layer, removing the dried layer and depositing a contact on the surface. U.S. Pat. No. 5,557,146 describes a CdTe device structure with an ohmic contact comprising a graphite paste containing mercury telluride and copper telluride.

FIG. 5 schematically shows an interface 52 formed between a CdTe layer 50 and a ZnTe layer 51 used for the formation of an ohmic contact. The prior art ZnTe layer 51 in this example is grown on top of the CdTe layer 50 by a prior art method such as sputtering or evaporation from a ZnTe source. The CdTe grains 53 of the CdTe layer 50 may be 1-5 microns in size. The ZnTe grains 54 of the ZnTe layer 51 may have a size of about 0.1-1 microns. Since the ZnTe layer 51 is grown on top of the already grown CdTe layer 50, the interface 52 between the two layers is very sharp and defective and it comprises electronic surface defects of the CdTe layer 50. In other words, there is a discontinuity and a break in the grain structure going from the CdTe layer 50 into the ZnTe layer 51. This break in the polycrystalline structure and lack of epitaxy introduces many electrically active interface states that act as recombination centers with high hole-electron recombination velocities, such as recombination velocities of $10^6$ cm/sec or higher. A CdTe solar cell with an absorber thickness of less than about 1.5 microns would not yield high efficiency if it is constructed with a defective CdTe/electron reflector interface such as the one shown in FIG. 5.

The present inventions provide improved ohmic contacts to CdTe films and facilitate the fabrication of ultra-thin devices.

SUMMARY OF THE PREFERRED EMBODIMENTS OF THE INVENTION

Embodiments of the invention are directed toward a method of making an improved ohmic contact for a solar cell and in particular for a CdTe solar cell. The method involves forming a Te-rich layer on the surface of a CdTe film which is the absorber of the solar or photo cell. Next, metallic forms of Zn and Cu are deposited on the Te-rich layer and then a contact layer is disposed on the Zn/Cu metallic forms.

Embodiments of the invention also are directed toward making an improved ohmic contact for a photovoltaic device such as a solar cell and to the resulting product. The solar cell has a transparent sheet, a transparent conductive layer disposed on the transparent sheet, a junction partner disposed on the transparent conductive oxide, a CdTe film disposed on the junction partner; a mixed interlayer of binary and/or ternary alloys comprising Cu, Te and Zn disposed on the CdTe film;

and an ohmic contact formed on an upper surface of the mixed interlayer. The mixed interlayer comprises Zn in an atomic ratio with Cu of at least 90%.

More generally, embodiments of the invention are directed toward a method of forming an ohmic contact to a surface of a thin film p-type semiconductor compound formed of at least Cd and Te and optionally at least one of Mn, Mg and Zn. The method comprising forming a Te enriched layer on the surface of the p-type semiconductor compound; depositing an interface layer on the Te enriched layer; and laying down a contact layer on the interface layer, wherein, the interface layer comprises a metallic form of Cu and Zn.

DETAILED DESCRIPTION OF THE INVENTION

Figure 2:
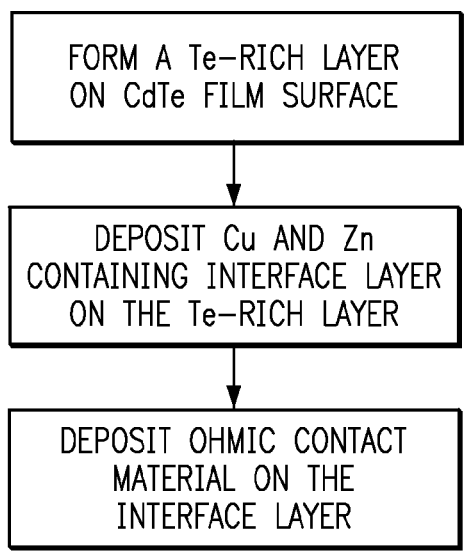
FIG. 2 shows the process flow for preferred embodiments of the present invention.

FIG. 2 shows the processing steps used to form an ohmic contact to a CdTe film in accordance with embodiments of the present invention. It should be noted that the method described herein is specifically suited for making ohmic contact to p-type CdTe material, which is commonly used in solar cell fabrication. As can be seen from FIG. 2, the first step of the process is to form a thin Te-rich layer on the surface of the CdTe film. The Te-rich layer can be obtained by various means, such as by depositing Te on the surface of the CdTe film using physical vapor deposition techniques (such as evaporation or sublimation and sputtering), by chemical vapor deposition (CVD) techniques or by chemically etching the surface of the CdTe film by an acidic etch solution. It is well known that acidic solutions, which may comprise at least one acid such as phosphoric acid, forming acid, sulfuric acid, bromine solution, chromic acid, nitric acid, etc., preferentially etch the Cd at the CdTe surface, leaving behind a Te-rich layer, i.e. a layer within which the Te/Cd molar ratio is larger than 1.0. The second step of the process involves deposition of an interface layer on the Te-rich layer, wherein the interface layer comprises Cu and Zn in their metallic form. The third step of the process involves deposition of an ohmic contact material on the interface layer.

Figure 3A:
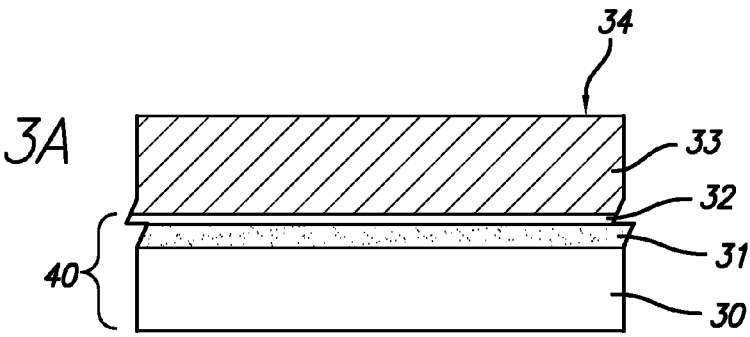
FIG. 3A shows a CdTe film deposited on a base.

FIGS. 3A, 3B, 3C and 3D show examples of the steps of the above described process, as it is applied to the fabrication of a solar cell. FIG. 3A depicts a stack comprising a transparent sheet 30, a transparent conductive layer such as a transparent conductive oxide layer 31, a junction partner layer 32 such as a CdS layer, and a CdTe film 33 which will be the absorber of the solar cell. The transparent sheet 30, the transparent conductive oxide layer 31 and the junction partner layer 32 together form a base 40. Once an ohmic contact layer is formed over the top surface 34 of the CdTe film 33, a solar cell would be obtained.

Figure 3B:
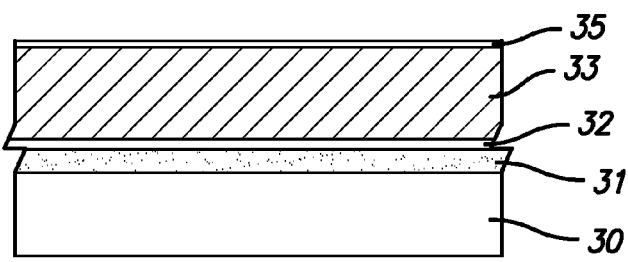
FIG. 3B shows a structure comprising a Te-rich layer on a surface of the CdTe film.

FIG. 3B shows a structure comprising a thin Te-rich layer 35 that is formed over the exposed surface of the CdTe film 33. As described before, the thin Te-rich layer 35 may be preferably formed by etching the exposed surface of the CdTe film 33 in an acidic solution. The thickness of the Te-rich layer 35 may be in the range of 5-200 nm, preferably in the range of 10-100 nm, and most preferably in the range of 20-50 nm.

Figure 3C:
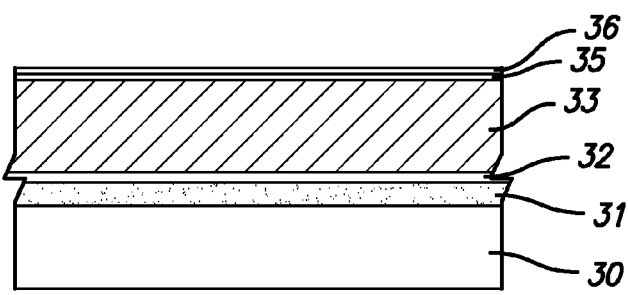
FIG. 3C shows an interface layer deposited on the Te-rich layer.

FIG. 3C shows an interface layer 36 formed on the Te-rich layer 35. The interface layer 36 comprises both Cu and Zn in their metallic form. The interface layer 36 may comprise a Cu/Zn stack or a Zn/Cu stack, or preferably, the interface layer 36 may comprise a metallic alloy of Cu—Zn. If the interface layer 36 is in the form of a Cu/Zn or Zn/Cu stack, the thickness of the Zn layer may be in the range of 2-50 nm, preferably in the range of 5-25 nm. The thickness of the Cu layer, on the other hand, may be in the range of 1-10 nm, preferably in the range of 2-5 nm. The stack may also comprise three or more layers of Cu and Zn, as for example, Cu/Zn/Cu or Zn/Cu/Zn/Cu. The thicknesses of the various layers of the stack are selected such that for the interface layer 36 as a whole, the atomic percent of Zn is preferably at least greater than 90% and more preferably in the range of 94-98% with the balance being Cu. Such atomic percentage should be taken into effect in selecting the total Cu and Zn thicknesses in the stack. The interface layer 36 may be deposited by various methods such as electrodeposition or physical vapor deposition, such as sputtering or evaporation. A preferred method for the deposition of the interface layer 36 is sputtering from a Cu—Zn alloy target.

Preferably, the interface layer 36 is a Cu—Zn metallic alloy with a thickness range of 2-50 nm, preferably a range of 5-30 nm, and most preferably in the range of 10-20 nm. The Cu—Zn metallic alloy has preferably a Zn content of at least 90 atomic percent (with the balance substantially being Cu). More preferably the metallic Cu—Zn alloy of the interface layer 36 has a Zn atomic percent in the range of 94-98% with the balance being substantially Cu.

The interface layer 36 consists essentially of only Cu and Zn in the amounts or ratios discussed above, and does not contain other materials except as impurities or trace amounts.

Figure 1:
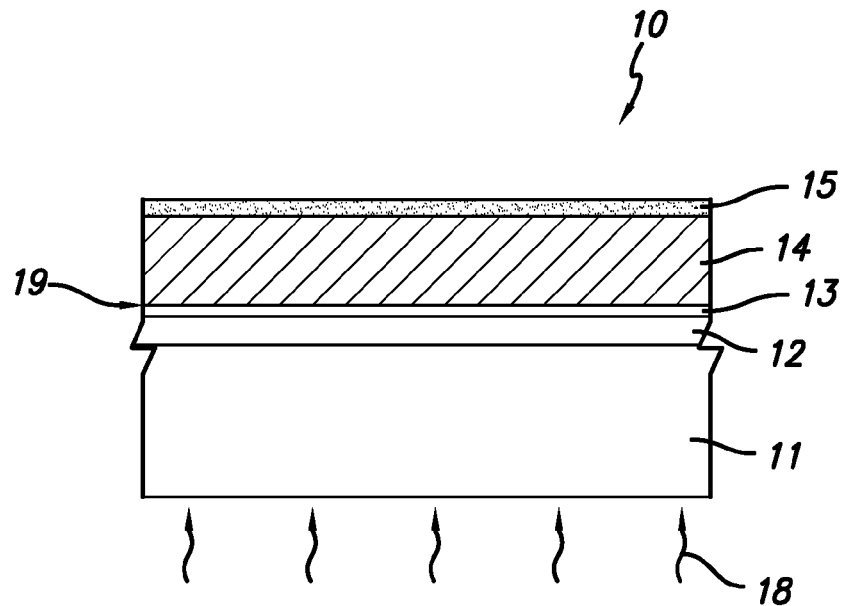
FIG. 1 is a cross-sectional view of a prior-art CdTe solar cell with a "super-strate structure".
Figure 3D:
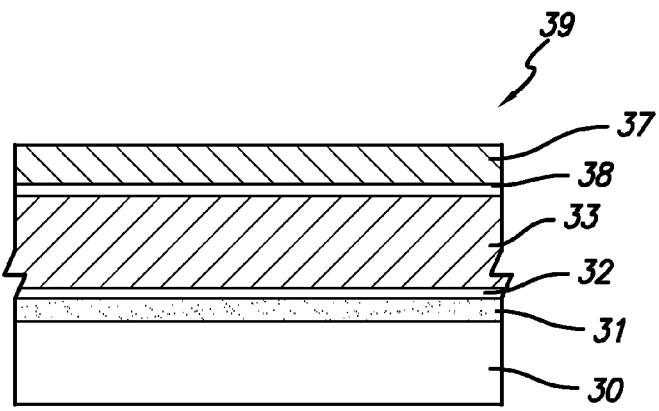
FIG. 3D is a cross sectional view of a CdTe solar cell structure formed in accordance with embodiments of the present invention.

FIG. 3D shows a finished device structure 39 obtained after a contact layer 37 is deposited. Contact layer 37 may be deposited by electrodeposition or physical vapor deposition techniques such as evaporation or sublimation and sputtering. Various materials such as Ni, Mo, Ta, Ti, Cr, Al, C, and their alloys or nitrides may be used in the contact layer 37. The contact layer may be a single layer of a material or it may comprise two or more layers of conductive materials such as those enumerated above. Moreover, two or more different materials selected from the group such as Ni, Mo, Ta, Ti, Cr, Al, C, and their alloys or nitrides may be used in the one or more layers constituting the contact layer 37. It should be noted that FIG. 3D does not show the Te-rich layer 35 and the interface layer 36 as two distinct layers, but instead depicts a mixed interlayer 38 between the CdTe film 33 and the contact layer 37. The reason for this is the fact that the Te-rich layer 35 and the interface layer 36 of FIG. 3C are relatively thin layers and they interact and may inter-diffuse during the step of depositing the contact layer 37. This interaction may form binary and ternary alloys comprising Cu, Te and Zn. It should also be noted that the finished device structure 39 may preferably be annealed at temperatures below 400° C., preferably in a temperature range of 150-350° C. to improve the electrical properties of the ohmic contact. During this annealing step, the Te-rich layer 35, and the interface layer 36 further intermix and react forming Zn—Cu—Te compounds that have low resistivity. Cu—Te alloys are low bandgap, low resistivity semiconductors. Zn—Te alloy is a large bandgap low resistivity semiconductor. The presence of these materials at the back contact provides a low contact resistance as well as a reflector for photogenerated electrons. As a result much thinner CdTe films, with thicknesses in the range of 0.5-1 microns (as opposed to 2-6 microns in the prior art of FIG. 1), may be fabricated using the contacting approach of the various embodiments of the present invention. Electron reflecting, low resistivity ohmic contact allows fabrication of cells with over 10% efficiency, even if the CdTe absorber layer thickness is less than 1 micron.

Benefits of using the Zn—Cu alloy interface layer of the present invention may be understood by comparing this to some of the other approaches. One method of making contact to a CdTe film is to sputter deposit a ZnTe layer on the CdTe surface as described in U.S. Pat. No. 5,909,632. This is then followed by deposition of a highly conductive contact layer such as C, Mo and Ni. This approach uses expensive ZnTe targets and slow RF sputtering approaches that cannot be controlled easily. The CdTe film also needs to be heated to over 300° C. during sputtering of the ZnTe film to be able to control the composition of the ZnTe film. The ZnTe film thickness in these approaches is at least 500 nm. Another contact forming method that was previously discussed involves deposition of a thin (1-5 nm) Cu layer on the CdTe surface followed by the deposition of a contact layer such as C, Mo and Ni. In this case controlling the thickness of the Cu layer, which is typically obtained by sputtering, is crucial. Too much Cu causes shorting, too little does not yield good ohmic contact. Therefore, control of this thickness in a manufacturing environment is difficult. Preferred embodiments of the present invention use a Te/Cu—Zn structure under the contact layer to form the ohmic contact. The Cu—Zn alloy layer may be obtained by sputtering using a Cu—Zn alloy target within which the Cu and Zn content is pre-determined and fixed. As a result, the composition of the interface layer deposited using this target is always the same from run-to-run in a production environment. Furthermore since the Cu amount in the Cu—Zn target is typically less than 10%, the thickness control limits for Cu—Zn alloy layers would not be as stringent as the thickness control limits necessary for pure Cu interface layers. This increases yield and simplifies the manufacturing process.

Figure 4:
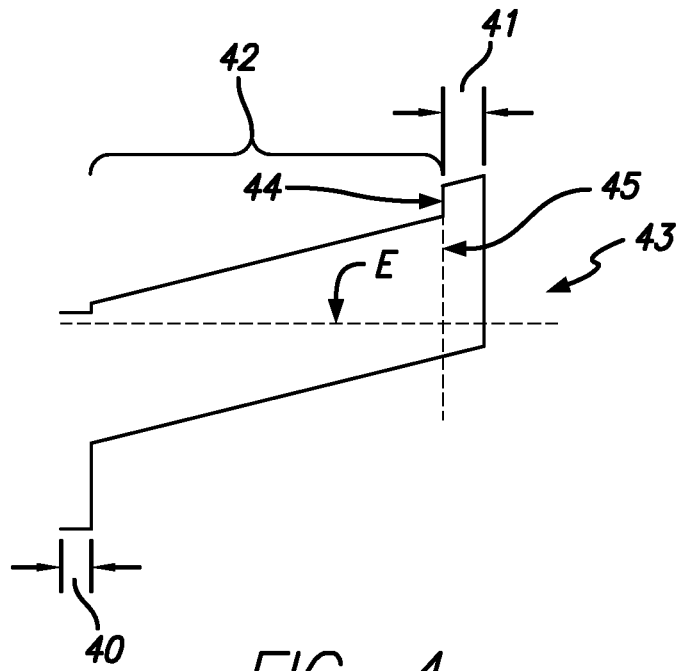
FIG. 4 shows an energy band diagram of a high efficiency CdTe device.

FIG. 4 shows an energy band diagram of an ideal high efficiency CdTe solar cell structure. Such structures are modeled in the literature (see for example K. Hsiao and J. Sites, 2009 IEEE PV Specialists Conference, page: 001846) and may yield very high efficiency (~20%) if they can be fabricated properly. The device structure comprises a 0.7-1.2 micrometer thick CdTe absorber layer 42 sandwiched between a 0.05-0.1 microns thick junction partner layer 40 such as a CdS layer and an electron reflector layer 41 such as a layer of ZnTe. The electron reflector layer 41 is contacted by a highly conductive ohmic contact 43 which may comprise a metal, metal nitride or carbon. The energy diagram in FIG. 4 shows the device under open circuit conditions in the dark. Therefore the Fermi level "E" is uniform. It is also noted that the CdTe absorber layer 42 is fully depleted with electrical field present everywhere. In fact in such device structures the thickness of the CdTe absorber layer 42 is selected so that it is fully depleted. Since the bandgap of the electron reflector layer 41 is larger than that of the CdTe absorber layer 42, there is a barrier 44 for electrons at the physical interface 45 between the CdTe absorber layer 42 and the electron reflector layer 41. The physical interface 45 is shown by a dotted line.

For the device design of FIG. 4 to work properly, the interface 45 needs to be free of electronic states with high recombination velocity. Otherwise electrons generated near the interface 45 would recombine with holes rather than being reflected back and getting collected by the CdS/CdTe junction. In prior art methods, as reviewed before, Cu-doped ZnTe layers have been used as ohmic contacts to relatively thick (>2 micrometer) CdTe solar cells. In those designs, the CdTe layer is not depleted and the device is not a p-i-n device such as the one shown in FIG. 4. In such a case the recombination velocity at the CdTe/ZnTe interface does not matter much since this interface is far from the CdS/CdTe junction.

Figure 5:
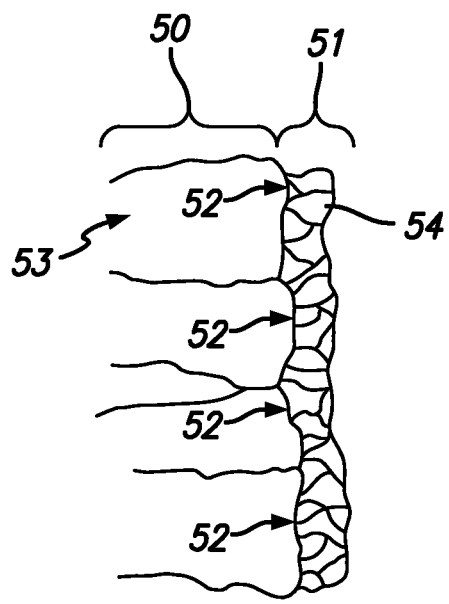
FIG. 5 shows a prior art CdTe/electron reflector interface that is defective.

FIG. 5 schematically shows an exemplary interface 52 formed between a CdTe layer 50 and a ZnTe layer 51. The prior art ZnTe layer 51 in this example is grown on top of the CdTe layer 50 by a prior art method such as sputtering or evaporation from a ZnTe source. The CdTe grains 53 of the CdTe layer 50 may be 1-5 microns in size. The ZnTe grains 54 of the ZnTe layer 51 may have a size of about 0.1-1 microns. Since the ZnTe layer 51 is grown on top of the already grown CdTe layer 50, the interface 52 between the two layers is very sharp and defective and it comprises electronic surface defects of the CdTe layer 50. In other words, there is a discontinuity and a break in the grain structure going from the CdTe layer 50 into the ZnTe layer 51. This break in the polycrystalline structure and lack of epitaxy introduces many electrically active interface states that act as recombination centers with high hole-electron recombination velocities, such as recombination velocities of $10^6$ cm/sec or higher. A CdTe solar cell with an absorber thickness of less than about 1.5 microns would not yield high efficiency if it is constructed with a defective CdTe/electron reflector interface such as the one shown in FIG. 5.

One preferred embodiment of the present invention is the formation of a (Cd, Zn, Mg, Mn)Te electron reflector layer on a CdTe absorber film such that the interface between the CdTe layer and the electron reflector layer is free from defects. This is achieved by: i) chemically or physically treating a surface of the CdTe absorber film to form a surface with Cd deficiency, ii) cleaning the Cd-deficient surface, if needed, so that the Te sites are activated, iii) providing at least one of Zn, Mn, and Mg to the Cd-deficient surface, and iv) causing a reaction between the Te within the Cd-deficient surface and the at least one of Zn, Mn, Mg species. These processing steps will now be further explained using an example shown in FIGS. 6A, 6B and 6C.

Figure 6A:
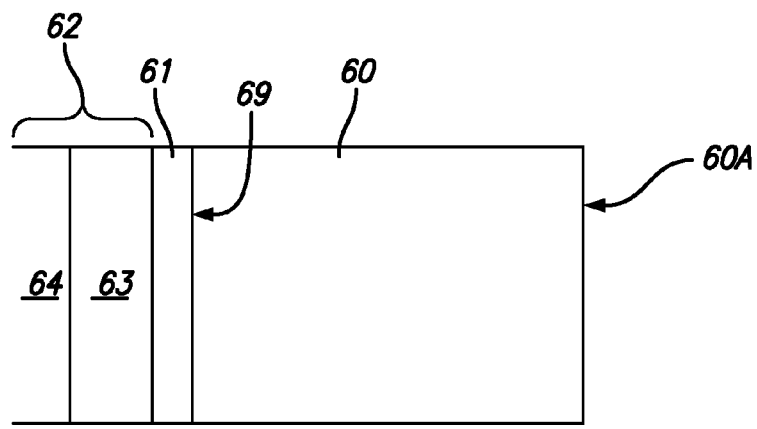
FIG. 6A shows a CdTe layer deposited on a junction partner layer.
Figure 6B:
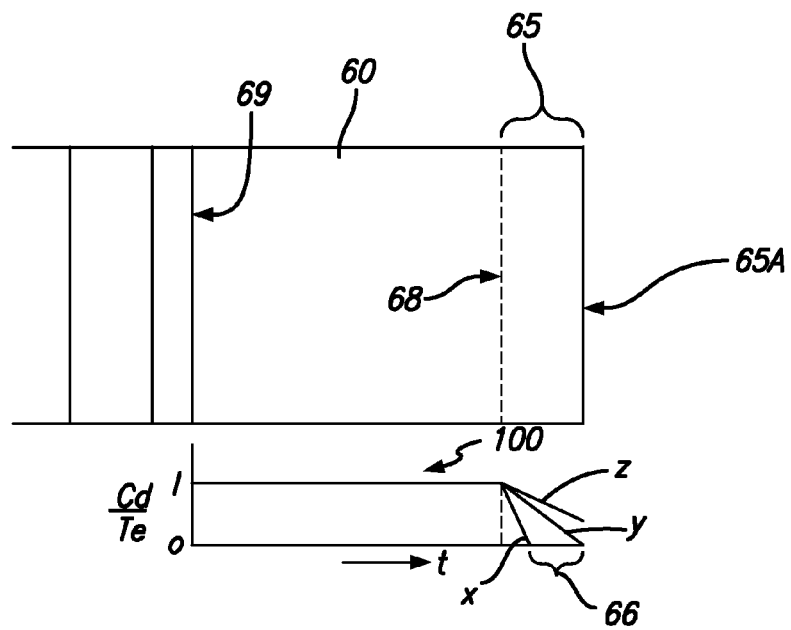
FIG. 6B shows a Cd-deficient surface region formed near the exposed surface of the CdTe layer of FIG. 6A and the Cd/Te molar ratio distribution within the Cd-deficient surface region.

As shown in FIG. 6A, a CdTe layer 60 may be deposited on a junction partner layer 61 such as a CdS layer forming a junction 69. The junction partner layer 61 maybe situated on a base 62 comprising a conductive transparent layer 63 and a transparent sheet 64 such as a sheet of glass. The CdTe layer 60 may have a thickness of less than about 2 micrometers, preferably less than about 1.5 micrometers. One preferred method of CdTe deposition is electrodeposition because this technique yields thin layers with minor finish surface as needed by high efficiency devices. The CdS/CdTe junction thus obtained may be heat treated with or without the presence of chlorine in an oxygen containing environment for grain growth and/or electronic quality enhancement. Such heat treatment methods for CdTe layers are well known in the field. Instead of depositing an electron reflector film such as a ZnTe film onto the exposed surface 60A of the CdTe layer 60 as has been done in prior art work (see for example, FIG. 5), the present invention converts a surface region of the CdTe layer 60 into an electron reflector layer. In other words, a portion of the CdTe layer 60 is used up in the process of forming the electron reflector. To form an electron reflector layer near the exposed surface 60A or face of the CdTe layer 60 involves several steps. Referring back to FIG. 6A and FIG. 6B, during the first step of the process the exposed surface 60A or face of the CdTe layer 60 may be chemically or physically treated to preferentially remove Cd, thus forming a Cd-deficient surface region 65. The Cd-deficient surface region is Te-rich. Chemical treatment methods include applying an acidic solution (such as one comprising nitric acid, chromic acid, hydrochloric acid, phosphoric acid, bromine, etc.) with a pH value of less than 7 onto the exposed surface 60A, which may preferentially remove Cd from the CdTe lattice. Physical treatment methods include bombardment of the surface by ions, such as argon ions, which also may preferentially remove Cd from the CdTe surface. It should be noted that these treatments convert the surface from a near stoichiometric CdTe surface with a Cd/Te molar ratio of about 1, into a Cd-deficient surface with a Cd/Te ratio of less than 1. The Cd/Te molar ratio through the thickness "t" of the absorber layer after the Cd removal process step is shown in the graph 100 of FIG. 6B. As can be seen from the graph 100, the Cd/Te ratio is 1 within the CdTe layer 60 between the junction 69 and the interface 68, indicating a stoichiometric CdTe layer. Then the Cd/Te ratio declines towards the top surface 65A of the Cd-deficient surface region 65. Three different examples of the Cd/Te ratio distribution through the Cd-deficient surface region 65 are shown as "x", "y" and "z" in the graph 100 of FIG. 6B. For the case of the distribution labeled as "x", the Cd/Te ratio goes to zero before the top surface 65A is reached, suggesting that a top surface section 66 comprises essentially Te, with substantially no Cd present. In the case of the distribution labeled as "y", the Cd/Te ratio goes to zero right at the top surface 65A. In case of the distribution labeled as "z", the Cd/Te ratio is larger than zero, but less than 1 throughout the Cd-deficient surface region 65. It should be noted that the thicknesses of the various layers or films shown in FIGS. 6A and 6B are not drawn to scale. Furthermore, the exposed surface 60A in FIG. 6A and the top surface 65A may not necessarily be at the same distance from the junction 69. Especially if a chemical etching process is employed for the formation of the Cd-deficient surface region 65, it is possible that some of the CdTe layer gets etched off during the process. Therefore, it may be necessary to start with a thicker CdTe layer (such as 1.3-1.8 microns thick) to obtain a thinner one (such as 1-1.5 microns thick) after the surface treatment step that forms the Cd-deficient surface region. The Cd-deficient surface region 65 of FIG. 6B may have a thickness in the range of 5-200 nm, preferably in the range of 10-100 nm, and most preferably in the range of 20-50 nm.

After the formation of the Cd-deficient surface region 65, a cleaning step may be beneficial depending on the nature of the treatment method used for the formation of the Cd-deficient surface region 65. If a physical method, such as ion bombardment, is utilized, there may not be a need for the cleaning step. If, however, a chemical method involving etching the CdTe surface with an acidic solution comprising an oxidizing agent is utilized, the Cd-deficient surface region 65 may contain some oxide residues, such as Cd-oxide and/or Te-oxide species. In this case the cleaning step may remove such oxide species so that no chemically active elemental Te and Cd are left within the Cd-deficient surface region 65. The cleaning step may include processes such as exposing the Cd-deficient surface region 65 to chemicals that reduce oxides. Such chemicals include, but are not limited to hydrazine and other organic etchants such as ethylenediamine and ethylenediaminetetraacetic acid (EDTA).

Figure 6C:
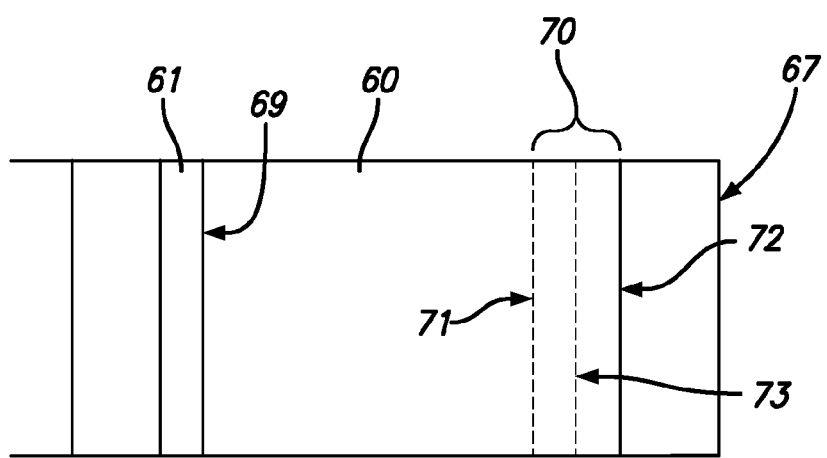
FIG. 6C shows a device structure with an electron reflector layer and low defectivity.

After the cleaning step the Cd-deficient surface region 65 is exposed to species that would form an electron reflector material through reaction with the Cd-deficient surface region 65. Such species include Zn, Mn and Mg, Zn being the preferred species. In one approach the Cd-deficient surface region 65 may be exposed to Zn vapors at elevated temperatures of over 200° C. As a result Zn may diffuse from the top surface 65A into the Cd-deficient surface region 65, react with Te and Cd within the Cd-deficient surface region 65 forming (Cd,Zn)Te, which is an electron reflector material. Alternately, Zn may be deposited onto the top surface 65A of the Cd-deficient surface region 65 and then a heat treatment step in a furnace or by laser, etc. may be used to diffuse the Zn into the Cd-deficient surface region 65 and promote its reaction with Te and Cd within the Cd-deficient surface region 65 to form (Cd,Zn)Te. FIG. 6C depicts a device structure resulting after the formation of the electron reflector material. As can be seen from this figure, above described process steps yield a CdTe layer 60 with an electron reflector layer 70 near its free surface. The nature of the electron reflector layer 70 depends on the nature of the Cd/Te molar ratio within the Cd-deficient surface region 65 before its exposure to and reaction with Zn. For example, if the Cd/Te molar ratio may be represented by the distribution labeled as "y" in FIG. 6B it is expected that the composition of the electron reflector layer would be (Cd,Zn)Te or $Cd_mZn_{(1-m)}Te$, where m continuously changes from 1 to 0 as one goes from location 71 (corresponding to interface 68 of FIG. 6B) to location 72 (corresponding to top surface 65A of FIG. 6B) shown in FIG. 6C. If the Cd/Te molar ratio may be represented by the distribution "x" shown in FIG. 6B it is expected that the composition of the electron reflector layer would be (Cd,Zn)Te or $Cd_mZn_{(1-m)}Te$, where m continuously changes from 1 to 0 as one goes from location 71 to location 73 and then stays at a value of zero between location 73 and location 72. Location 73 corresponds to the end, zero point of the curve x in graph 100 of FIG. 6B. If, on the other hand, the Cd/Te molar ratio may be represented by the distribution labeled as "z" in FIG. 6B it is expected that the composition of the electron reflector layer would be (Cd,Zn)Te or $Cd_mZn_{(1-m)}Te$, where m continuously changes from 1 to a value between 0 and 1 as one goes from location 71 to location 72. Dopants such as Cu, Sb, As, etc. may also be included into the electron reflector layer 70 by exposing the Cd-deficient surface region 65 to such dopants, in addition to the Zn, Mg, Mn species. A solar cell can be made from the structure of FIG. 6C by applying an ohmic contact 67 onto the electron reflector layer 70.

As can be appreciated from the discussion above, the device structure shown in FIG. 6C and the method of forming it are very different from the prior art device structure depicted in FIG. 5 and its method of fabrication. As explained before, in the structure of FIG. 5 the interface 52 between the CdTe layer 50 and the ZnTe layer 51 (which is an electron reflector layer) is defective and sharp, i.e. one side of the interface 52 is CdTe and the other side is ZnTe with a structural and compositional break right at the interface 52. In the structure of FIG. 6C, the interface between the CdTe layer 60 and the electron reflector layer 70 corresponds to location 71 and it is free of defects because it is formed within the original CdTe lattice, within the same CdTe grains by replacing at least some of the Cd atoms with Zn atoms. Furthermore, this interface is not compositionally sharp but it is graded. In other words, the material changes from CdTe at the location 71 to (Cd,Zn)Te with more and more Zn content as one moves towards the surface (location 72). As a result, carrier recombination velocities at the location 71 may be two or three orders of magnitude lower than those in the structure of FIG. 5.

Embodiments of the invention may thus be characterized as method of forming a CdTe solar cell by depositing a CdTe layer; treating an exposed face of the CdTe layer to form a Cd-deficient surface region, the Cd-deficient surface region having a free surface and an interface with the CdTe layer; exposing the Cd-deficient surface region through its free surface to at least one electron reflector forming species; causing a reaction between the Cd-deficient surface region and the at least one electron reflector forming species to convert the Cd-deficient surface region into an electron reflector layer; and laying down a contact layer on the electron reflector layer. Further, the Cd/Te molar ratio within the Cd-deficient surface region decreases monotonically from 1 at the interface with the CdTe layer to a value less than 1 towards the free surface.

The treating step may comprise applying at least one of a liquid chemical, a gaseous chemical and accelerated ions to the exposed face of the CdTe layer to selectively remove Cd. There may be further a step of cleaning after the step of treating to remove oxides of Cd and Te from the Cd-deficient surface region. The electron reflector forming species may comprise at least one of Zn, Mn and Mg. Further, the reaction between the Cd-deficient surface region and the at least one of Zn, Mn and Mg may be caused by a thermal treatment at a temperature over 200° C. The electron reflector layer may preferably be a (Cd,Zn)Te layer.

Embodiments of the invention may also be characterized as a CdTe solar cell having a conductive oxide layer; a junction partner layer on the conductive oxide layer; a CdTe absorber layer; a Cd-deficient region which acts as an electron reflector on the surface of the CdTe absorber layer; and an ohmic contact formed on the electron reflector. A Cd/Te molar ratio within the Cd-deficient region continuously decreases from 1 at an interface with the CdTe absorber layer to a value less than 1 towards the ohmic contact. The electron reflector may comprise an electron reflector forming species comprising at least one of Zn, Mn and Mg and preferably being a (Cd,Zn)Te layer.

Although the present invention is described with respect to certain preferred embodiments, modifications thereto will be apparent to those skilled in the art.

What is claimed is:

1. A method of forming a CdTe solar cell comprising:
   depositing a CdTe layer;
   treating an exposed face of the CdTe layer to form a Cd-deficient surface region, the Cd-deficient surface region having a free surface and an interface with the CdTe layer;
   exposing the Cd-deficient surface region through its free surface to at least one electron reflector forming species;
   causing a reaction between the Cd-deficient surface region and the at least one electron reflector forming species to convert the Cd-deficient surface region into an electron reflector layer; and
   laying down a contact layer on the electron reflector layer;
   wherein the Cd/Te molar ratio within the Cd-deficient surface region decreases monotonically from 1 at the interface with the CdTe layer to a value less than 1 towards the free surface.

2. The method in claim 1 wherein the step of treating comprises applying at least one of a liquid chemical, a gaseous chemical and accelerated ions to the exposed face of the CdTe layer to selectively remove Cd.

3. The method in claim 2 further including a step of cleaning after the step of treating to remove oxides of Cd and Te from the Cd-deficient surface region.

4. The method in claim 2 wherein the electron reflector forming species comprise at least one of Zn, Mn and Mg.

5. The method in claim 4 wherein the reaction between the Cd-deficient surface region and the at least one of Zn, Mn and Mg is caused by a thermal treatment at a temperature over 200° C.

6. The method in claim 5 wherein the electron reflector layer is a (Cd,Zn)Te layer.

* * * * *